US010797000B2

(12) United States Patent
Deshpande et al.

(10) Patent No.: US 10,797,000 B2
(45) Date of Patent: *Oct. 6, 2020

(54) EMBEDDED MULTI-DEVICE BRIDGE WITH THROUGH-BRIDGE CONDUCTIVE VIA SIGNAL CONNECTION

(71) Applicant: INTEL CORPORATION, Santa Clara, CA (US)

(72) Inventors: Nitin A. Deshpande, Chandler, AZ (US); Omkar G. Karhade, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/254,126

(22) Filed: Jan. 22, 2019

(65) Prior Publication Data

US 2019/0157205 A1 May 23, 2019

Related U.S. Application Data

(60) Continuation of application No. 15/668,179, filed on Aug. 3, 2017, now Pat. No. 10,229,882, which is a
(Continued)

(51) Int. Cl.
*H01L 23/538* (2006.01)
*H01L 25/065* (2006.01)
(Continued)

(52) U.S. Cl.
CPC ........ *H01L 23/5383* (2013.01); *H01L 21/486* (2013.01); *H01L 23/13* (2013.01);
(Continued)

(58) Field of Classification Search
None
See application file for complete search history.

(56) References Cited

U.S. PATENT DOCUMENTS 9,754,890 B2 * 9/2017 Deshpande ......... H01L 23/5383
2004/0115919 A1 6/2004 Takaoka
(Continued)

FOREIGN PATENT DOCUMENTS

| KR | 20060074091 | 7/2006 |
| KR | 20070006327 | 1/2007 |
| TW | 201225762 | 6/2012 |

OTHER PUBLICATIONS

International Preliminary Report on Patentability from PCT/US2014/018482 dated Sep. 9, 2016, 6 pgs.
(Continued)

*Primary Examiner* — Long Pham
(74) *Attorney, Agent, or Firm* — Green, Howard & Mughal LLP (57) ABSTRACT

A microelectronic structure includes a substrate having a first surface and a cavity extending into the substrate from the substrate first surface, a first microelectronic device and a second microelectronic device attached to the substrate first surface, and a bridge disposed within the substrate cavity and attached to the first microelectronic device and to the second microelectronic device. The bridge includes a plurality conductive vias extending from a first surface to an opposing second surface of the bridge, wherein the conductive vias are electrically coupled to deliver electrical signals from the substrate to the first microelectronic device and the second microelectronic device. The bridge further creates at least one electrical signal connection between the first microelectronic device and the second microelectronic device.

14 Claims, 8 Drawing Sheets

Related U.S. Application Data division of application No. 15/114,036, filed as application No. PCT/US2014/018482 on Feb. 26, 2014, now Pat. No. 9,754,890.

(51) Int. Cl.

| | |
|---|---|
| *H01L 25/00* | (2006.01) |
| *H01L 23/13* | (2006.01) |
| *H01L 23/522* | (2006.01) |
| *H01L 21/48* | (2006.01) |
| *H01L 23/00* | (2006.01) |

(52) U.S. Cl.
CPC ........ *H01L 23/522* (2013.01); *H01L 23/5381* (2013.01); *H01L 23/5384* (2013.01); *H01L 23/5385* (2013.01); *H01L 24/97* (2013.01); *H01L 25/0652* (2013.01); *H01L 25/0655* (2013.01); *H01L 25/50* (2013.01); *H01L 2224/0401* (2013.01); *H01L 2224/0557* (2013.01); *H01L 2224/06181* (2013.01); *H01L 2224/14* (2013.01); *H01L 2224/16145* (2013.01); *H01L 2224/16227* (2013.01); *H01L 2224/16238* (2013.01); *H01L 2224/1703* (2013.01); *H01L 2225/0651* (2013.01); *H01L 2225/06513* (2013.01); *H01L 2225/06541* (2013.01); *H01L 2924/15153* (2013.01); *H01L 2924/15192* (2013.01)

(56) References Cited

U.S. PATENT DOCUMENTS

| | | |
|---|---|---|
| 2006/0226527 A1 | 10/2006 | Hatano et al. |
| 2010/0327424 A1 | 12/2010 | Braunisch et al. |
| 2011/0285006 A1 | 11/2011 | Weng et al. |
| 2014/0049932 A1 | 2/2014 | Camarota |

OTHER PUBLICATIONS

International Search Report and Written Opinion from PCT/US2014/018482 dated Nov. 25, 2014, 9 pgs.
Notice of Allowance from Korean Patent Application No. 10-2016-7020273 dated Sep. 29, 2017, 3 pgs.
Notice of Allowance from Taiwan Patent Application No. 104101977 dated May 12, 2016, 3 pgs.
Notice of Allowance from U.S. Appl. No. 15/114,036 dated May 17, 2017, 7 pgs
Notice of Grant from Japanese Patent Application No. 2016-546503 dated Aug. 1, 2017, 3 pgs.
Office Action for Chinese Patent Application No. 201480074129.5, dated Jan. 11, 2019.
Office Action for Chinese Patent Application No. 201480074129.5, dated Apr. 23, 2018.
Office Action for U.S. Appl. No. 15/668,179, dated May 3, 2018.
Office Action from Taiwan Patent Application No. 104101977 dated Jan. 30, 2016, 3 pgs.
Restriction Requirement from U.S. Appl. No. 15/114,036 dated Dec. 19, 2016, 9 pgs.
Supplementary European Search Report for European Patent Applicarion No. 14884116, dated Oct. 12, 2017.
Examination Report for Malaysian Patent Application No. PI 2016702663, dated Aug. 7, 2019.
Third Office Action for Chinese Patent Application No. 201480074129.5, dated Jul. 12, 2019.
Notice of Allowance for Chinese Patent Application No. 201480074129.5, dated Nov. 1, 2019.
Notice of Allowance for Malaysian Patent Application No. PI 2016702663, dated Apr. 23, 2020.

\* cited by examiner

EMBEDDED MULTI-DEVICE BRIDGE WITH
THROUGH-BRIDGE CONDUCTIVE VIA
SIGNAL CONNECTION

RELATED APPLICATION

The present application is a Continuation Application of U.S. patent application Ser. No. 15/668,179, filed on Aug. 3, 2017, entitled "EMBEDDED MULTI-DEVICE BRIDGE WITH THROUGH-BRIDGE CONDUCTIVE VIA SIGNAL CONNECTION", which is a Divisional Application of U.S. patent application Ser. No. 15/114,036, filed on Jul. 25, 2016, now U.S. Pat. No. 9,754,890, issued on Sep. 5, 2017, entitled "EMBEDDED MULTI-DEVICE BRIDGE WITH THROUGH-BRIDGE CONDUCTIVE VIA SIGNAL CONNECTION", which is a national stage entry of PCT Patent Application No. PCT/US14/18482, filed on Feb. 26, 2014, entitled "EMBEDDED MULTI-DEVICE BRIDGE WITH THROUGH-BRIDGE CONDUCTIVE VIA SIGNAL CONNECTION", which is hereby incorporated herein by reference in its entirety and for all purposes.

TECHNICAL FIELD

Embodiments of the present description generally relate to the field of microelectronic package fabrication, and, more particularly, to a microelectronic structure including a bridge embedded in a substrate for electrical signal connection between microelectronic devices, wherein the bridge includes conductive vias extending through the bridge for electrical signal connection between the substrate and the microelectronic devices.

BACKGROUND

The microelectronic industry is continually striving to produce ever faster and smaller microelectronic packages for use in various electronic products. As part of this effort, microelectronic packages containing multiple devices, such a microelectronic dice, have been developed. These multiple microelectronic device packages are referred to in the art as multi-device or multi-chip packages (MCPs) and offer the potential for increased architectural flexibility at reduced cost, but must do so such that appropriate microelectronic device-to-microelectronic device interconnect densities are provided. As will be understood to those skilled in the art, interconnect density is an important consideration because an insufficient number of microelectronic device connections would limit the bandwidth capability for the affected microelectronic device interface, and thus would reduce the communication efficiency and capability between microelectronic devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include a microelectronic structure comprising a substrate having a first surface and a cavity extending into the substrate from the substrate first surface, a first microelectronic device and a second microelectronic device attached to the substrate first surface, and a bridge disposed within the substrate cavity and attached to the first microelectronic device and to the second microelectronic device. The bridge includes a plurality conductive vias extending from a first surface to an opposing second surface of the bridge. wherein the conductive vias are electrically coupled to deliver electrical signals from the substrate to the first microelectronic device and to the second microelectronic device. The bridge further creates at least one electrical signal connection between the first microelectronic device and the second microelectronic device.

Embodiments of the present description may enable density scaling of structures within a microelectronic package that may represent a significant improvement over existing technology generations by making use of silicon bridges (or bridges made of other materials) that are embedded in the microelectronic substrate. These bridges support dense microelectronic device-to-microelectronic device interconnect from a first microelectronic device edge to a second microelectronic device edge, and a number of signals lines through the bridge. Thus, a resulting microelectronic package may be considerably smaller than a microelectronic package that is only interconnected with conductive routes within the microelectronic substrate. In addition to increasing communication bandwidth due to high density microelectronic device-to-microelectronic device interconnect structures, embodiments of the present description may also enable improved assembly processes due (at least in part) to the maturity of silicon process technology. Furthermore, the increased high density microelectronic device-to-microelectronic device interconnect structures on the bridge may result in cost savings, modularity, and/or architectural flexibility. Examples of such potential benefits include improved reticle and semiconductor wafer utilization by microelectronic device aspect ratio optimization, the ability to combine within a single package microelectronic dice using different optimized silicon (or other) processes or dies incorporating differing or incompatible design methodologies, the potential to assemble non-rectangular or large "super-dice," the ability to combine dies or die stacks with differing heights, and the like.

Figure 1:
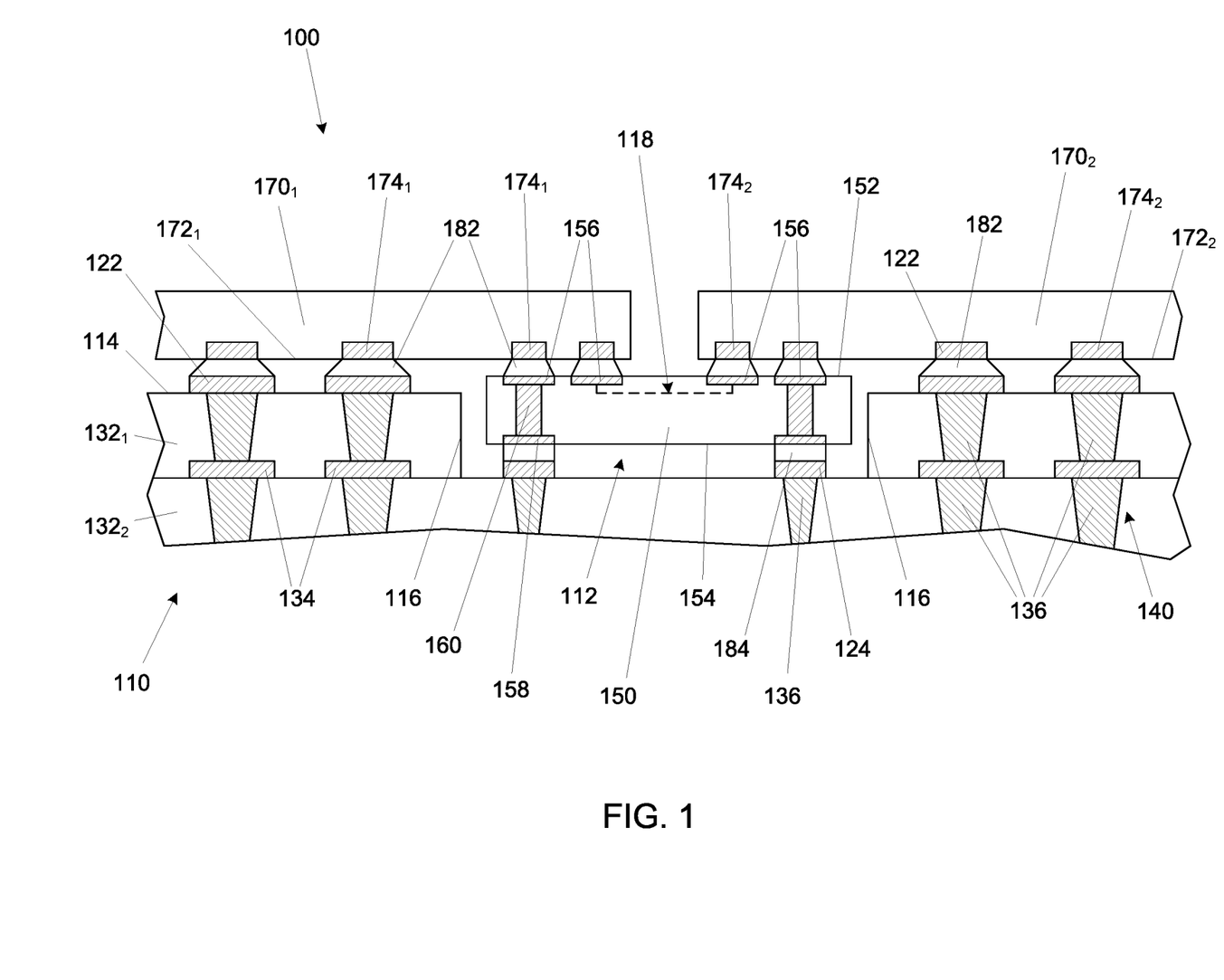
FIG. 1 illustrates a cross-sectional view of a microelectronic structure comprising microelectronic devices attached to a substrate, wherein a bridge embedded in the substrate provides signal routes from the substrate to the microelectronic devices and provide signal routes between the microelectronic devices, according to an embodiment of the present description.

FIG. 1 illustrates a microelectronic structure 100 including a microelectronic substrate 110, a bridge 150, and a plurality of microelectronic devices (illustrated as a first microelectronic device $170_1$ and a second microelectronic device $170_2$). The microelectronic substrate 110 may include a cavity 112 from therein and extending into the microelectronic substrate 110 from a first surface 114 thereof to form microelectronic substrate cavity sidewalls 116 and a microelectronic substrate cavity bottom surface 118. The microelectronic substrate 110 may further include a plurality of substrate bond pads 122 formed in or on the microelectronic substrate first surface 114 and a plurality of substrate cavity bond pads 124 formed in or on the microelectronic substrate cavity bottom surface 118. The microelectronic substrate cavity 112 may be formed by any known technique known in the art, including, but not limited to, photolithographic processes.

The microelectronic substrate 110 may be any appropriate microelectronic substrate, including, but not limited to, an interposer, a motherboard, and the like. The first microelectronic devices $170_1$ and a second microelectronic device $170_2$ (as well as any further microelectronic devices that may be utilized) may be any appropriate microelectronic devices, such as microelectronic dice, including, but not limited to a microprocessor, a chipset, a graphics device, a wireless device, a memory device, an application specific integrated circuit device, and the like.

As further shown in FIG. 1, the microelectronic substrate 110 may comprise a plurality of dielectric layers (illustrated as a first dielectric layer $132_1$ and a second dielectric layer $132_2$) having a plurality of conductive routes 140 formed from conductive traces 134 formed on at least one of the dielectric layers (illustrated as being formed on the second dielectric layer $132_2$) wherein connections are formed between structures, such as the conductive traces 134, the substrate bond pads 122, and the substrate cavity bond pads 124, with conductive vias 136 formed through the various dielectric layers (illustrated as a first dielectric layer $132_1$ and a second dielectric layer $132_2$). As will be understood to those skilled in the art, the conductive routes 140 form electrical communication paths between microelectronic devices within a package and/or with external component. The processes and material use for forming the microelectronic substrate 110 are well known in the art, and, for the sake of brevity and conciseness, will not be described or illustrated herein.

As still further shown in FIG. 1, the first microelectronic device $170_1$ and the second microelectronic device $170_2$ may be attached to the microelectronic substrate 110 and the bridge 150 through a plurality of interconnects 182, such as reflowable solder bumps or balls, in a configuration generally known as a flip-chip or controlled collapse chip connection ("C4") configuration. The interconnects 182 may extend between bond pads $172_1$ on an active surface $174_1$ of the first microelectronic device $170_1$ and corresponding substrate bond pads 122, and between the first microelectronic device bond pads $172_1$ and corresponding bond pads 156 on a first surface 152 of the bridge 150 to form an electrical connection therebetween. The interconnects 182 may also extend between bond pads $172_2$ on an active surface $174_2$ of the second microelectronic device $170_2$ and corresponding substrate bond pads 122, and between the second microelectronic device bond pads $172_2$ and corresponding bridge bond pads 156 to form an electrical connection therebetween. It is understood that the first microelectronic device bond pads $172_1$ may be in electrical communication with integrated circuitry (not shown) within the first microelectronic device $170_1$, and that the second microelectronic device bond pads $172_2$ may be in electrical communication with integrated circuitry (not shown) within the second microelectronic device $170_2$.

As still further shown in FIG. 1, the bridge 150 may include a second surface 154, opposing the bridge first surface 152, having a plurality of bond pads 158 formed therein or thereon. The bridge second surface bond pads 158 may be attached to corresponding substrate cavity bond pads 124 through a plurality of bridge-to-substrate interconnects 184, such as reflowable solder bumps or balls. The bridge 150 may include a plurality of through-bridge conductive vias 160, wherein each of the plurality of through-bridge conductive vias 160 extends between a corresponding bridge first surface bond pad 156 and a corresponding bridge second surface bond pad 158, such that at least one through-bridge conductive via 160 is electrically coupled to deliver electrical signals from the microelectronic substrate 110 to the first microelectronic device $170_1$ and such that at least another conductive via 160 is electrically coupled to deliver electrical signals from the microelectronic substrate 110 to the second microelectronic device $170_2$. In one embodiment, the through-bridge conductive vias 160 are electrically coupled to deliver power to the microelectronic devices $170_1$, $170_2$. The bridge 150 may further create an electrical signal connection between the first microelectronic device $170_1$ and the second microelectronic device $170_2$ with at least one signal line 162 (illustrated as a dashed line) extending between one bridge first surface bond pad 156 electrically connected to the first microelectronic device $170_1$ and another bridge first surface bond pad 156 electrically connected to the second microelectronic device $170_2$.

In one embodiment, the bridge 150 may comprise silicon-containing components. As will be understood to those skilled in the art, silicon bridges may be used because silicon process technology is relatively advanced, and interconnect pitches and line widths for the signal lines 162 that are achievable using existing silicon process technology may be significantly smaller, and thus more dense, than what is possible using, for example, currently available technology for copper signal lines in polymer layers.

FIGS. 2A to 2F illustrate various embodiments for fabricating the bridge 150. The specific techniques, equipment, and operating parameters thereof for the fabrication of the bridge 150 are well known in the art and, for the sake of clarity and conciseness, will not be discussed with specificity herein.

Figure 2A:
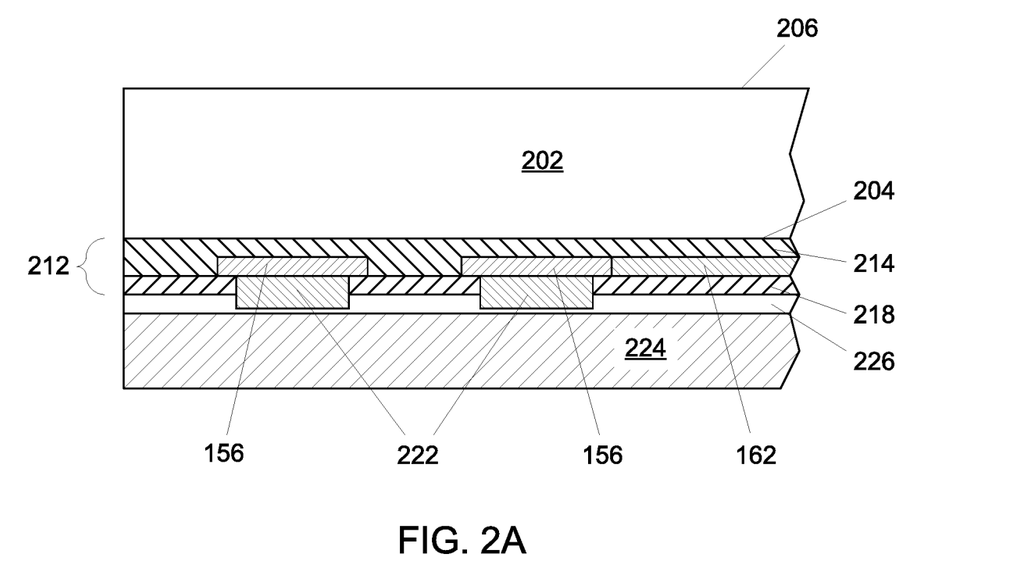
FIGS. 2A-2F illustrate cross-sectional views of the formation of a bridge, according to one embodiment of the present description.

As show in FIG. 2A, a silicon substrate 202 may be formed having an interconnection layer 212 on a first surface 204 thereof. The interconnection layer 212 may comprises at least one interconnect dielectric layer 214, such as silicon dioxide, formed on the silicon substrate first surface 204. The bridge first surface bond pads 156 and the signal line(s) 162 may be formed in or on the interconnect dielectric layer 214. A solder resist layer 218, such as silicon nitride, may be formed on the interconnect dielectric layer 214, and an interconnect material 222, such a solder material, for the formation of the interconnects 182 (see FIG. 1) between the bridge first surface bond pads 156 and the microelectronic devices $170_1$, $170_2$ (see FIG. 1), may be disposed through the solder resist layer 218 to contact the bridge first surface bond pads 156. The interconnect material 222 and the solder resist layer 218 may be adhered to a carrier 224 with an adhesive layer 226, wherein the silicon substrate 202 may be thinned to a desired thickness after attachment to the carrier 224, as will be understood to those skilled in the art.

Figure 2B:
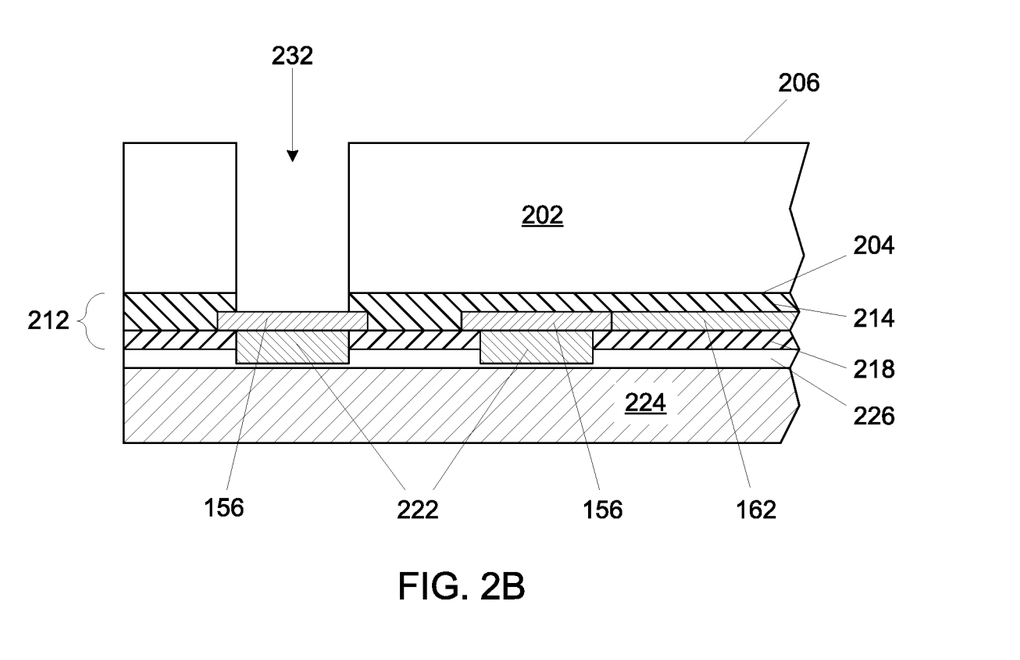

As shown in FIG. 2B, at least one via 232 may be formed through the silicon substrate 202, from a second surface 206 of the silicon substrate 202 to the silicon substrate first surface 204 and through the interconnect dielectric layer 214 to expose a portion of at least one bridge first surface bond pad 156. The vias 232 may be formed by any appropriate technique known in the art, including, but not limited to, photolithography/etching, laser drill, ion ablation, and the like.

Figure 2C:
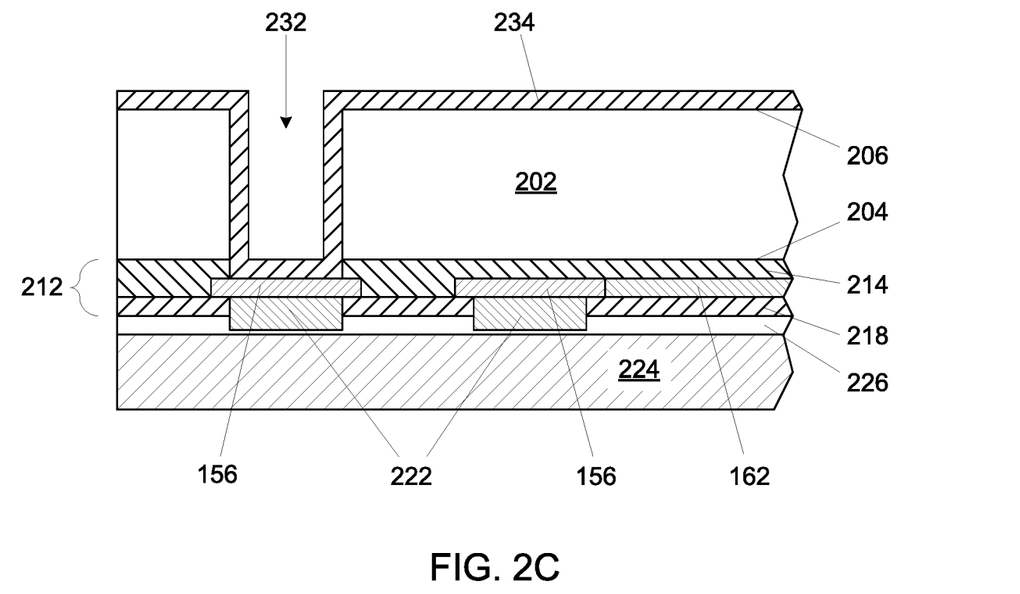
Figure 2D:
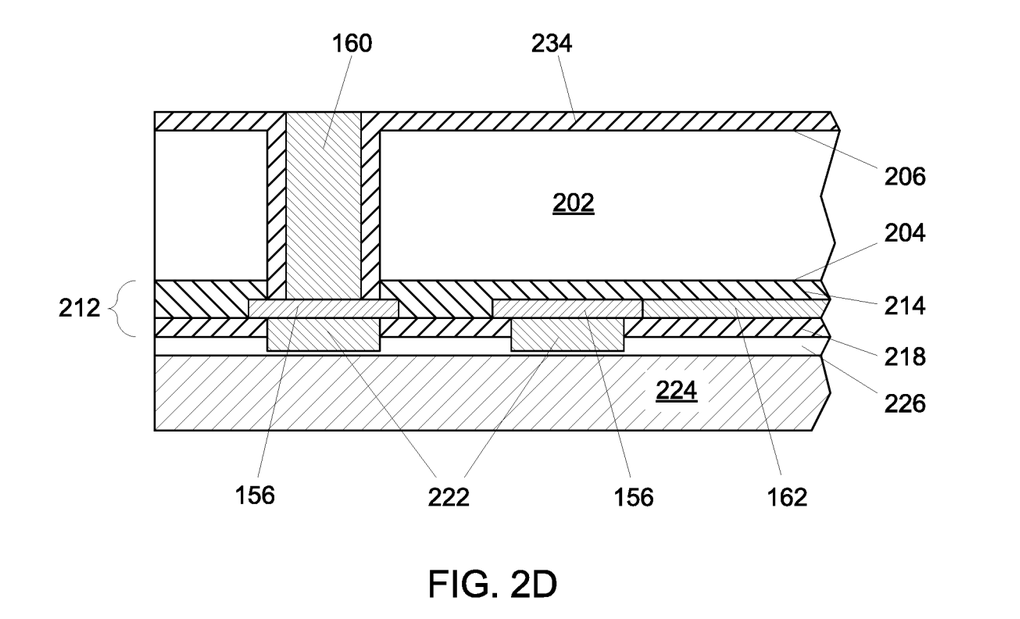
Figure 2E:
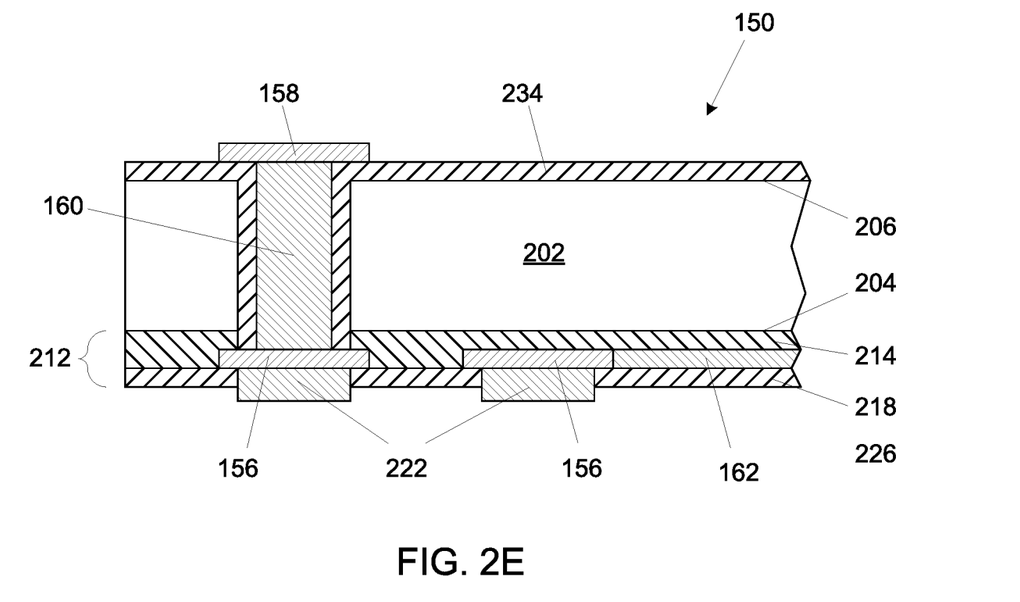

As shown in FIG. 2C, a dielectric liner 234 may be formed to line the vias 232 by the conformal deposition of a dielectric material, such as silicon dioxide. As shown in FIG. 2D, a portion of the dielectric liner 234 abutting the bridge first surface bond pad 156 may be removed by any appropriate technique known in the art and a conductive material may be deposited in the vias 232 (see FIG. 2C) to form the through-bridge conductive vias 160. In one embodiment, the through-bridge conductive vias 160 may be formed by a plating technique to fill the vias 232 (see FIG. 2C) with a metal, such as copper. Any metal external to the vias 232 (see FIG. 2C) may be removed by etching, chemical mechanical polishing, or the like. As shown in FIG. 2E, the bridge second surface bond pad 158 may be formed to contact the through-bridge conductive via 160 to form the bridge 150, wherein the bridge 150 may be removed from the carrier 224 with an adhesive layer 226 also removed from the bridge 150.

In some embodiments, the bridge 150 can be a passive structure, in that it has no functionality other than to provide a high-speed, high-density signal lines 162 between microelectronic devices $170_1$ and $170_2$ and to provide the through-bridge conductive vias 160 for signal paths between the substrate 110 and the microelectronic devices $170_1$ and $170_2$. In other embodiments, the bridge 140 comprises an active die, having its own functionality apart from a bridging function, and, thus, may have integrated circuitry, such as transistors, resistor, capacitors, and the like, formed in or on the silicon substrate 202 (shown generically with dashed line 240 in FIG. 2F). In further embodiments, the bridge 150 could have a design enabled for hybrid assembly, such as having both bridge first surface bond pads 156 for interconnect to the microelectronic devices $170_1$, $170_2$ and pads (not shown) for wirebond connections to the microelectronic substrate first surface 114 or other devices (not shown) attached to the microelectronic substrate first surface 114. It is understood that although the silicon substrate 202 is referred to with the term "silicon", it may comprise other semiconducting materials such as gallium arsenide (GaAs), silicon germanium (SiGe), or any other suitable semiconducting material or combination of semiconducting materials, when integrated circuitry 240 is formed therein, and it also is understood that the bridge 150 may be formed from non-semiconducting materials when no integrated circuitry 240 is to be formed.

Figure 2F:
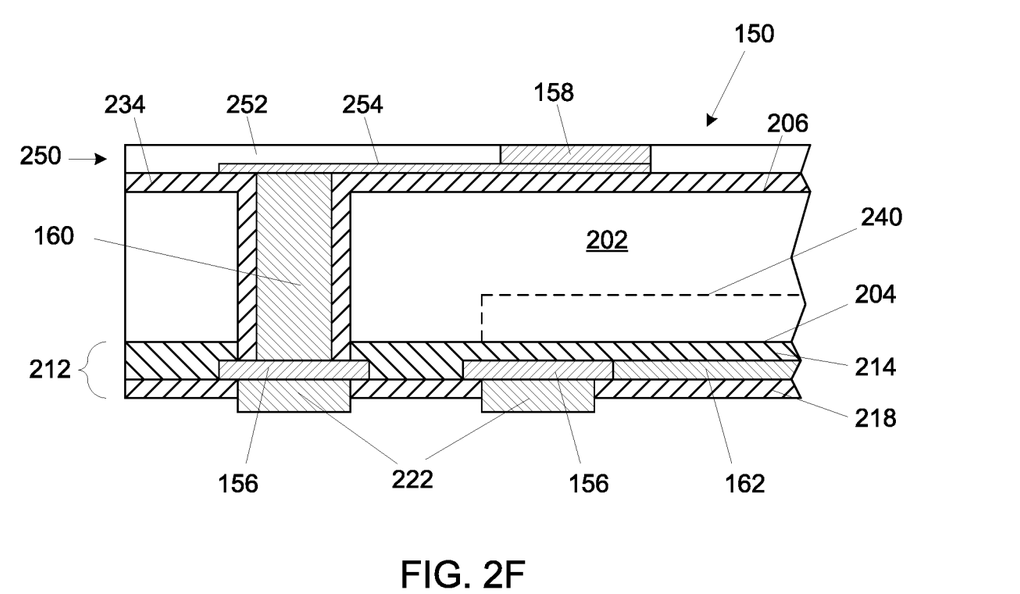

As further shown in FIG. 2F, the bridge second surface 154 may include at least one redistribution layer 250 to reposition at least one bridge second surface bond pad 158. The redistribution layer 250 may include at least one redistribution dielectric layer 252 and a redistribution conductive trace 254 formed between the through-bridge conductive via 160 and the bridge second surface bond pad 158.

Embodiments of the present description may also enable the precise alignment of the bridge 150 to the microelectronic substrate 110. Such alignment may be important in the creation of high density interconnection between the microelectronic devices $170_1$, $170_2$ with the signal lines 162. In one example, if the placement accuracy of a device placement tool is approximately 5 μm for the bridge 150 to the microelectronic substrate 110 placement, and the microelectronic devices $170_1$, $170_2$ to the bridge 150 or microelectronic substrate 110 placement, then the root mean square of the combined placement error is about 7 μm. Assuming a solder bump (used to form the interconnects 182 between the bridge 150 and the microelectronic devices $170_1$, $170_2$) diameter to be half the pitch of the signal traces 162 with at least half coverage of the bridge first surface bond pads 156, a pitch of about 28 μm may be achieved.

A further potential advantage of the embodiments of the present description may include designing the bridge 150 such that it consumes only one dielectric layer, as illustrated in FIG. 1 with the first dielectric layer $132_1$. This is difficult to achieve when using embedded non-silicon bridges, as a dielectric layer is needed above the bridge to form vias and pads as will be understood to those skilled in the art.

Figure 3A:
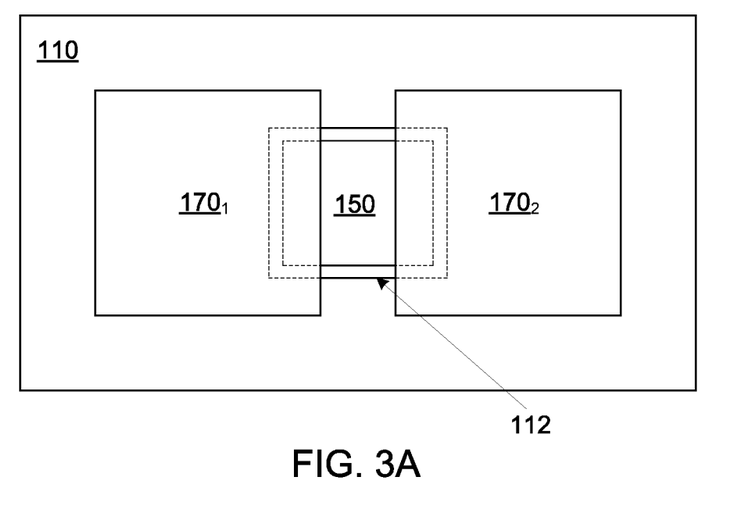
FIGS. 3A-3D illustrate top plan views of various of potential configurations of microelectronic devices and bridges, according to embodiments of the present description.
Figure 3B:
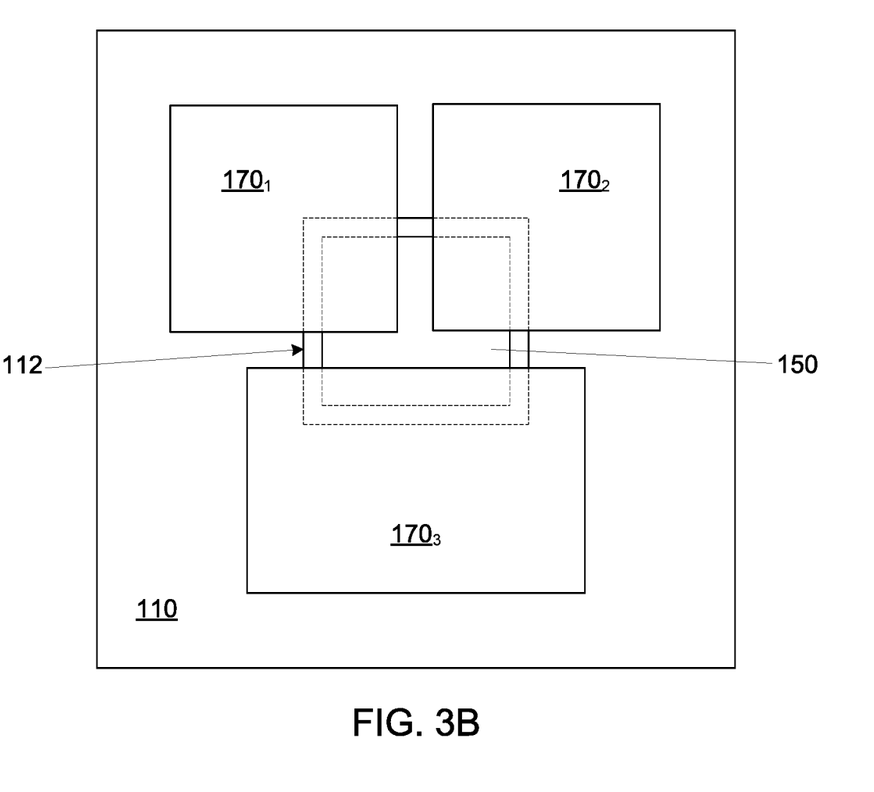
Figure 3C:
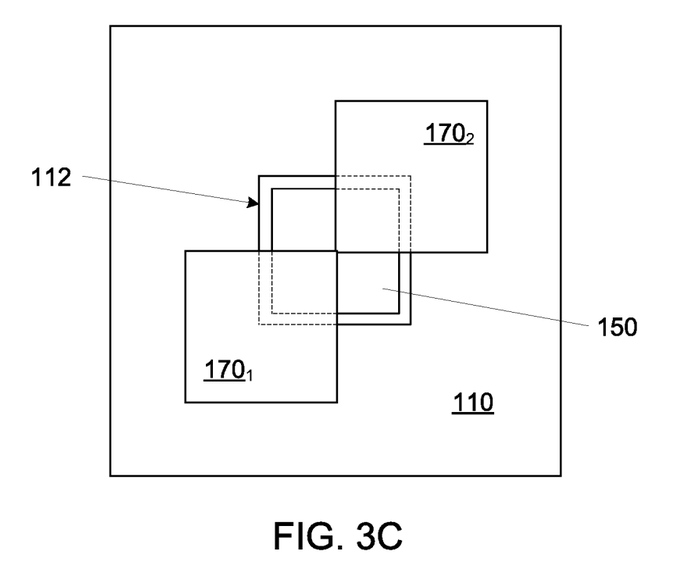
Figure 3D:
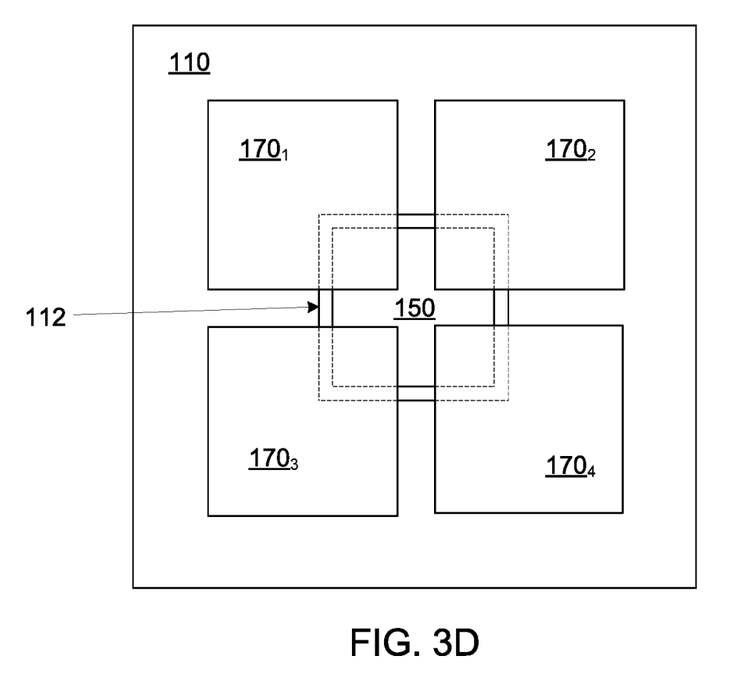

Although the FIG. 1 illustrates two microelectronic devices $170_1$, $170_2$, it is understood that multiple microelectronic devices and configurations may be utilized. FIG. 3A illustrates a top plan view of a potential linear arrangement of two microelectronic devices $170_1$, $170_2$. FIG. 3B illustrates a top plan view of a potential arrangement of three microelectronic devices $170_1$, $170_2$, and $170_3$. FIG. 3C illustrates a top plan view of a potential diagonal arrangement of two microelectronic devices $170_1$, $170_2$. FIG. 3D illustrates a top plan view of a potential arrangement of four microelectronic devices $170_1$, $170_2$, $170_3$, and $170_4$.

Figure 4:
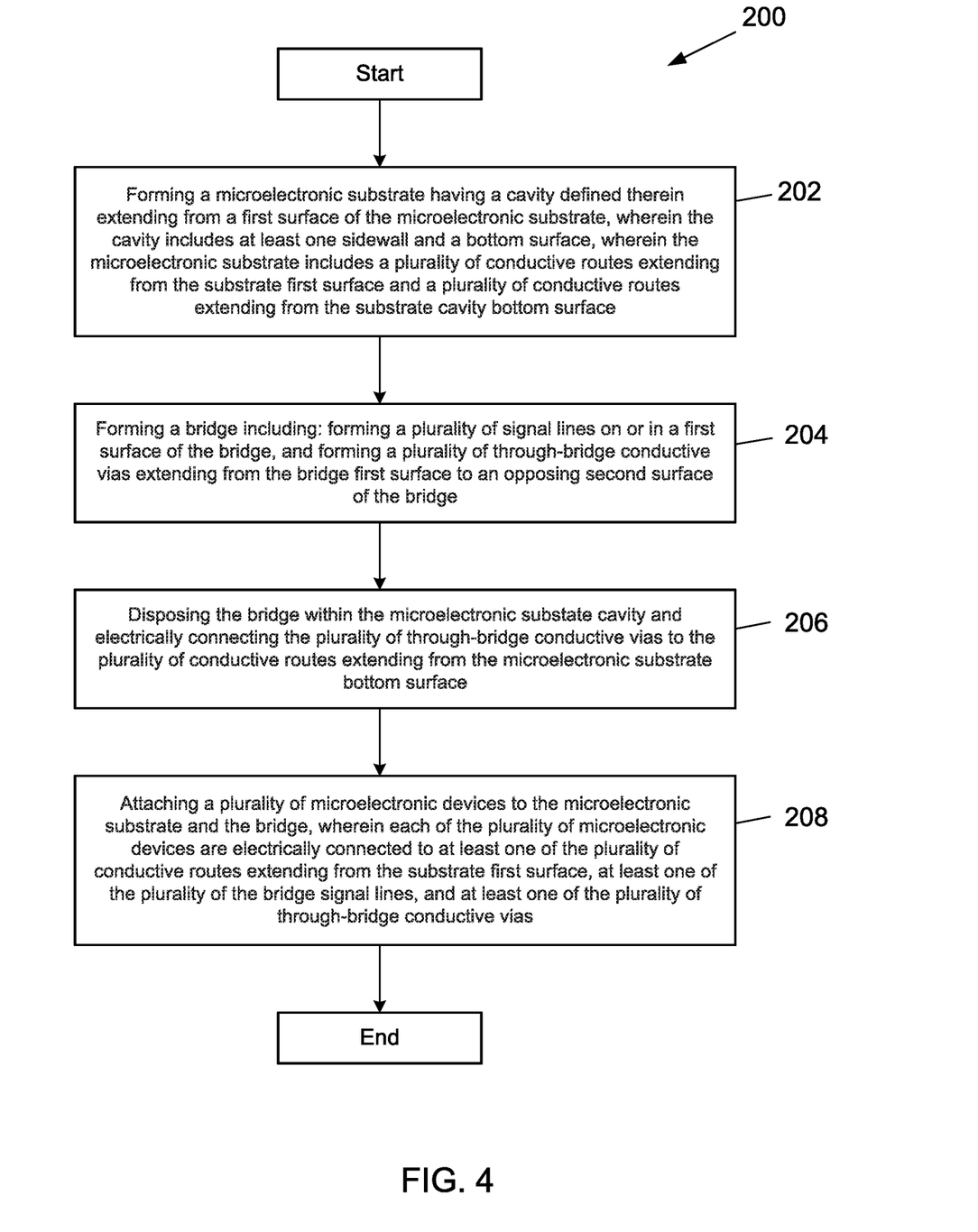
FIG. 4 is a flow chart of a process of fabricating a microelectronic structure, according to an embodiment of the present description.

FIG. 4 is a flow chart of a process 200 of fabricating a microelectronic structure according to an embodiment of the present description. As set forth in block 202, a microelectronic substrate may be formed having a cavity defined therein extending from a first surface of the microelectronic substrate, wherein the cavity includes at least one sidewall and a bottom surface, wherein the microelectronic substrate includes a plurality of conductive routes extending from the substrate first surface and a plurality of conductive routes extending from the substrate cavity bottom surface. A bridge may be formed including forming a plurality of signal lines formed on or in a first surface of the bridge and forming a plurality of through-bridge conductive vias formed to extend from the bridge first surface to an opposing second surface of the bridge, as set forth in block 204. As set forth in block 206, the bridge may be disposed within the microelectronic substrate cavity with the plurality of through-bridge conductive vias electrically connected to the plurality of conductive routes extending from the microelectronic substrate bottom surface. A plurality of microelectronic devices may be attached to the microelectronic substrate and the bridge, wherein each of the plurality of microelectronic devices are electrically connected to at least one of the plurality of conductive routes extending from the substrate first surface, at least one of the plurality of the bridge signal lines, and at least one of the plurality of through-bridge conductive vias, as set forth in block 208.

Figure 5:
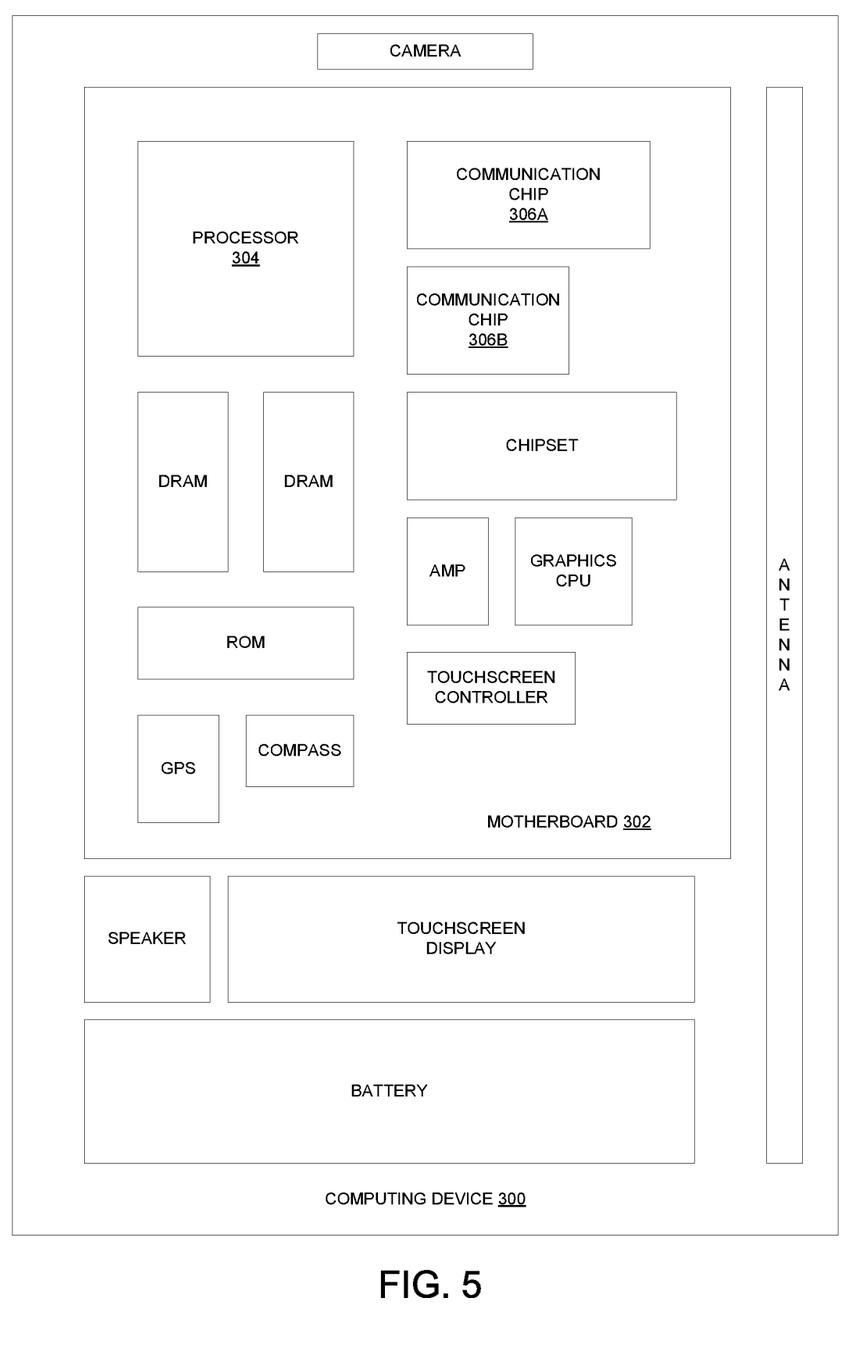
FIG. 5 illustrates a computing device in accordance with one implementation of the present description.

FIG. 5 illustrates a computing device 300 in accordance with one implementation of the present description. The computing device 300 houses a board 302. The board 302 may include a number of components, including but not limited to a processor 304 and at least one communication chip 306A, 306B. The processor 304 is physically and electrically coupled to the board 302. In some implementations the at least one communication chip 306A, 306B is also physically and electrically coupled to the board 302. In further implementations, the communication chip 306A, 306B is part of the processor 304.

Depending on its applications, the computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306A, 306B enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306A, 306B. For instance, a first communication chip 306A may be dedicated to shorter range wireless communications such as Wi-Fi and Bluetooth and a second communication chip 306B may be dedicated to longer range wireless communications such as GPS, EDGE, GPRS, CDMA, WiMAX, LTE, Ev-DO, and others.

The processor 304 of the computing device 300 may include a plurality microelectronic devices packaged within the processor 304. In some implementations of the present description, the microelectronic devices of the processor 304 may be connected to one another with a bridge having a through-bridge via, as described above. The term "processor" may refer to any device or portion of a device that processes electronic data from registers and/or memory to transform that electronic data into other electronic data that may be stored in registers and/or memory.

The communication chip 306A, 306B may include a plurality microelectronic devices packaged within the communication chip 306A, 306B. In accordance with another implementation of the present description, the microelectronic devices of the communication chip may be connected to one another with a bridge having a through-bridge via formed in accordance with implementations described above.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-5. The subject matter may be applied to other microelectronic devices and assembly applications, as well as any appropriate electronic application, as will be understood to those skilled in the art.

The following examples pertain to further embodiments. Specifics in the examples may be used anywhere in one or more embodiments.

In Example 1, a microelectronic structure may comprise a microelectronic substrate having a cavity defined therein extending from a first surface of the microelectronic substrate, wherein the cavity includes at least one sidewall and a bottom surface, wherein the microelectronic substrate includes a plurality of conductive routes extending from the substrate first surface and a plurality of conductive routes extending from the substrate cavity bottom surface; a bridge, disposed within the microelectronic substrate cavity, having a plurality of signal lines formed on or in a first surface of the bridge and a plurality of through-bridge conductive vias extending from the bridge first surface to an opposing second surface of the bridge, wherein the plurality of through-bridge conductive vias are electrically connected to the plurality of conductive routes extending from the microelectronic substrate bottom surface; and a plurality of microelectronic devices, wherein each of the plurality of microelectronic devices are electrically connected to at least one of the plurality of conductive routes extending from the substrate first surface, at least one of the plurality of the bridge signal lines, and at least one of the plurality of through-bridge conductive vias.

In Example 2, the subject matter of Example 1 can optionally include the bridge comprising silicon-containing components.

In Example 3, the subject matter of any of Examples 1 to 2 can optionally include the bridge comprising a passive structure.

In Example 4, the subject matter of any of Examples 1 to 2 can optionally include the bridge comprising an active structure.

In Example 5, the subject matter of any of Examples 1 to 4 can optionally include the bridge comprising a silicon substrate having an interconnection layer on a first surface thereof, wherein the interconnection layer comprises at least one dielectric layer formed on the silicon substrate first surface; wherein a plurality of bridge first surface bond pads and the plurality of bridge signal lines are formed in or on the dielectric layer; and further comprising a dielectric liner disposed between the through-bridge conductive vias and the silicon substrate.

In Example 6, the subject matter of any of Examples 1 to 5 can optionally include the microelectronic substrate comprising a plurality of dielectric layers having the plurality of conductive routes formed therein.

In Example 7, the subject matter of Example 6 can optionally include the conductive routes comprising at least one conductive trace formed on at least one of the plurality of dielectric layers and at least one conductive via extending through at least one of the plurality of dielectric layers.

In Example 8, the subject matter of any of Examples 1 to 6 can optionally include at least one of the plurality of microelectronic devices attached to the microelectronic substrate and to the bridge through a plurality of interconnects.

In Example 9, the subject matter of Example 8 can optionally include at least one of the plurality of interconnects extending between one of a plurality of bond pads on an active surface of one microelectronic device and a corresponding substrate bond pads, and another of the plurality of interconnects extending between another of plurality of the microelectronic device bond pads and a corresponding bond pad of a plurality of bond pads on a first surface of the bridge.

In Example 10, the subject matter of any of Examples 1 to 9 can optionally include a plurality of bond pads formed in or on the bridge second surface to contact corresponding through-bridge conductive vias and attached to corresponding substrate cavity bond pads formed in or on the substrate cavity bottom surface through a plurality of bridge-to-substrate interconnects.

In Example 11, a method of forming a microelectronic structure may comprise forming a microelectronic substrate having a cavity defined therein extending from a first surface of the microelectronic substrate, wherein the cavity includes at least one sidewall and a bottom surface, wherein the microelectronic substrate includes a plurality of conductive routes extending from the substrate first surface and a plurality of conductive routes extending from the substrate cavity bottom surface; forming a bridge including: forming a plurality of signal lines on or in a first surface of the bridge, and forming a plurality of through-bridge conductive vias extending from the bridge first surface to an opposing second surface of the bridge disposing the bridge within the microelectronic substate cavity and electrically connecting the plurality of through-bridge conductive vias to the plurality of conductive routes extending from the microelectronic substrate bottom surface; and attaching a plurality of microelectronic devices to the microelectronic substrate and the bridge, wherein each of the plurality of microelectronic devices are electrically connected to at least one of the plurality of conductive routes extending from the substrate first surface, at least one of the plurality of the bridge signal lines, and at least one of the plurality of through-bridge conductive vias.

In Example 12, the subject matter of Example 11 can optionally include forming the bridge from at least one silicon-containing component.

In Example 13, the subject matter of any of Examples 11 to 12 can optionally include forming the bridge as a passive structure.

In Example 14, the subject matter of any of Examples 11 to 12 can optionally include forming the bridge comprises as an active structure.

In Example 15, the subject matter of any of Examples 11 to 14 can optionally include forming the bridge comprising forming a silicon substrate having an interconnection layer on a first surface thereof, wherein the interconnection layer comprises at least one dielectric layer formed on the silicon substrate first surface; forming a plurality of bridge first surface bond pads and the plurality of bridge signal lines in or on the dielectric layer; and disposing a dielectric liner between the through-bridge conductive vias and the silicon substrate.

In Example 16, the subject matter of any of Examples 12 to 15 can optionally include forming microelectronic substrate comprising forming a plurality of dielectric layers having the plurality of conductive routes therein.

In Example 17, the subject matter of Example 16 can optionally include forming the conductive routes comprising forming at least one conductive trace on at least one of the plurality of dielectric layers and forming at least one conductive via through at least one of the plurality of dielectric layers.

In Example 18, the subject matter of any of Examples 11 to 17 can optionally include attaching the plurality of microelectronic devices comprising attaching the plurality of microelectronic devices to the microelectronic substrate and to the bridge through a plurality of interconnects.

In Example 19, the subject matter of Example 18 can optionally include attaching the plurality of microelectronic devices to the microelectronic substrate and to the bridge through a plurality of interconnects comprising attaching the plurality of microelectronic devices to the microelectronic substrate and to the bridge with at least one of the plurality of interconnects extending between at least one of a plurality of bond pads on an active surface of one microelectronic device and a corresponding substrate bond pads, and another of the plurality of interconnects extending between at least another of the plurality the microelectronic device bond pads and a corresponding bond pad of a plurality of bond pads on a first surface of the bridge.

In Example 20, the subject matter of any of Examples 11 to 19 can optionally include forming a plurality of bond pads in or on the bridge second surface to contact corresponding through-bridge conductive vias and attaching the plurality of bridge second surface bond pads to corresponding substrate cavity bond pads formed in or on the substrate cavity bottom surface with a plurality of bridge-to-substrate interconnects.

In Example 21, the subject matter of any of Examples 11 to 20 can optionally include delivering power to at least one microelectronic device through at least one of the plurality of through-bridge conductive vias.

In Example 22, a computing device may comprise a board; a microelectronic device attached to the board; and a microelectronic structure disposed within the microelectronic device, wherein the microelectronic structure comprises: a microelectronic substrate having a cavity defined therein extending from a first surface of the microelectronic substrate, wherein the cavity includes at least one sidewall and a bottom surface, wherein the microelectronic substrate includes a plurality of conductive routes extending from the substrate first surface and a plurality of conductive routes extending from the substrate cavity bottom surface; a bridge disposed within the microelectronic substrate having a plurality of signal lines formed on or in a first surface of the bridge and a plurality of through-bridge conductive vias extending from the bridge first surface to an opposing second surface of the bridge, wherein the plurality of through-bridge conductive vias are electrically connected to the plurality of conductive routes extending from the microelectronic substrate bottom surface; and a plurality of microelectronic devices, wherein each of the plurality of microelectronic devices are electrically connected to al least one of the plurality of conductive routes extending from the substrate first surface, at least one of the plurality of the bridge signal lines, and at least one of the plurality of through-bridge conductive vias.

In Example 23, the subject matter of Example 22 can optionally include the bridge comprising a silicon substrate having an interconnection layer on a first surface thereof, wherein the interconnection layer comprises at least one dielectric layer formed on the silicon substrate first surface; wherein a plurality of bridge first surface bond pads and the plurality of bridge signal lines are formed in or on the dielectric layer; and further comprising a dielectric liner disposed between the through-bridge conductive vias and the silicon substrate.

In Example 24, the subject matter of any of Examples 22 to 23 can optionally include at least one of the plurality of microelectronic devices attached to the microelectronic substrate and to the bridge through a plurality of interconnects, wherein at least one of the plurality of interconnects extends between one of a plurality of bond pads on an active surface of one microelectronic device and a corresponding substrate bond pads, and another of the plurality of interconnects extends between another of plurality of the microelectronic device bond pads and a corresponding bond pad of a plurality of bond pads on a first surface of the bridge.

In Example 25, the subject matter of any of Examples 22 to 24 can optionally include a plurality of bond pads formed in or on the bridge second surface to contact corresponding through-bridge conductive vias and attached to corresponding substrate cavity bond pads formed in or on the substrate cavity bottom surface through a plurality of bridge-to-substrate interconnects.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic structure comprising:
a microelectronic substrate having a cavity, wherein the microelectronic substrate includes a plurality of conductive routes extending from a first surface of the microelectronic substrate and a plurality of conductive routes extending into the microelectronic substrate from a bottom surface of the cavity;
a bridge disposed within the cavity, wherein the bridge has a plurality of signal lines, wherein the bridge has a plurality of through-bridge conductive vias extending from the first surface of the bridge to a second surface of the bridge, and wherein at least one through-bridge conductive vias of the plurality of through-bridge conductive vias is electrically connected to at least one conductive route of the plurality of conductive routes at the bottom surface of the cavity;
a first microelectronic device, wherein the first microelectronic device is electrically attached to at least one conductive route of the plurality of conductive routes extending from a first surface of the microelectronic substrate, wherein the first microelectronic device is electrically attached to at least one signal line of the plurality of the signal lines, and wherein the first microelectronic device is electrically attached to at least one through-bridge conductive via of the plurality of through-bridge conductive vias; and
a second microelectronic device, wherein the second microelectronic device is electrically attached to at least one conductive route of the plurality of conductive routes extending from a first surface of the microelectronic substrate, wherein the second microelectronic device is electrically attached to at least one signal line of the plurality of the signal lines, and wherein the second microelectronic device is electrically attached at least one through-bridge conductive via of the plurality of through-bridge conductive vias;
wherein the first microelectronic device is electrically connected to the second microelectronic device through at least one signal line of the plurality of signal lines of the bridge.

2. The microelectronic structure of claim 1, wherein the bridge comprises silicon.

3. The microelectronic structure of claim 1, wherein the bridge comprises an active device.

4. The microelectronic structure of claim 1, wherein the bridge comprises a substrate having an interconnection layer on a first surface thereof, wherein the interconnection layer comprises at least one dielectric layer formed on the first surface of the substrate, and the plurality of bridge signal lines are formed in or on the at least one dielectric layer.

5. The microelectronic structure of claim 4, wherein the bridge comprises silicon.

6. The microelectronic structure of claim 4, wherein the bridge comprises an active device.

7. The microelectronic structure of claim 4, further comprising a dielectric liner disposed between the through-bridge conductive vias and the substrate and between the through-bridge conductive vias and the interconnection layer.

8. A computing device, comprising:
a board;
a microelectronic device attached to the board; and
a microelectronic structure disposed within the microelectronic device, wherein the microelectronic structure comprises:
a microelectronic substrate having a cavity, wherein the microelectronic substrate includes a plurality of conductive routes extending from a first surface of the microelectronic substrate and a plurality of conductive routes extending into the microelectronic substrate from a bottom surface of the cavity;
a bridge disposed within the cavity, wherein the bridge has a plurality of signal lines, wherein the bridge has a plurality of through-bridge conductive vias extending from the first surface of the bridge to a second surface of the bridge, and wherein at least one through-bridge conductive vias of the plurality of through-bridge conductive vias is electrically connected to at least one conductive route of the plurality of conductive routes at the bottom surface of the cavity;

a first microelectronic device, wherein the first microelectronic device is electrically attached to at least one conductive route of the plurality of conductive routes extending from a first surface of the microelectronic substrate, wherein the first microelectronic device is electrically attached to at least one signal line of the plurality of the signal lines, and wherein the first microelectronic device is electrically attached to at least one through-bridge conductive via of the plurality of through-bridge conductive vias; and a second microelectronic device, wherein the second microelectronic device is electrically attached to at least one conductive route of the plurality of conductive routes extending from a first surface of the microelectronic substrate, wherein the second microelectronic device is electrically attached to at least one signal line of the plurality of the signal lines, and wherein the second microelectronic device is electrically attached at least one through-bridge conductive via of the plurality of through-bridge conductive vias;

wherein the first microelectronic device is electrically connected to the second microelectronic device through at least one signal line of the plurality of signal lines of the bridge.

9. The computing device of claim 8, wherein the bridge comprises silicon.

10. The computing device of claim 8, wherein the bridge comprises an active device.

11. The computing device of claim 8, wherein the bridge comprises a substrate having an interconnection layer on a first surface thereof, wherein the interconnection layer comprises at least one dielectric layer formed on the first surface of the substrate, and the plurality of bridge signal lines are formed in or on the at least one dielectric layer.

12. The computing device of claim 11, wherein the bridge comprises silicon.

13. The computing device of claim 11, wherein the bridge comprises an active device.

14. The computing device of claim 11, further comprising a dielectric liner disposed between the through-bridge conductive vias and the substrate and between the through-bridge conductive vias and the interconnection layer.

* * * * *